United States Patent [19]

Nagano et al.

[11] Patent Number: 5,455,117
[45] Date of Patent: * Oct. 3, 1995

[54] ELECTROMAGNETIC WAVE REFLECTION-PREVENTING MATERIAL AND ELECTROMAGNETIC WAVE REFLECTION-PREVENTING METHOD

[75] Inventors: Toshiaki Nagano; Hideo Kogure; Naozumi Iwasawa; Tetsu Maki, all of Hiratsuka, Japan

[73] Assignee: Kansai Paint Co., Ltd., Amagasaki, Japan

[ * ] Notice: The portion of the term of this patent subsequent to Sep. 26, 2012 has been disclaimed.

[21] Appl. No.: 140,564

[22] Filed: Oct. 25, 1993

[30] Foreign Application Priority Data

Oct. 27, 1992 [JP] Japan .................................. 4-310764
Nov. 13, 1992 [JP] Japan .................................. 4-328557

[51] Int. Cl.⁶ ................................................ B32B 9/00
[52] U.S. Cl. ........................ 428/545; 428/546; 428/549; 174/35 C; 174/35 R; 174/35 MS
[58] Field of Search .................................. 428/545, 546, 428/549; 174/35 C, 35 R, 35 MS

[56] References Cited

U.S. PATENT DOCUMENTS

| | | | |
|---|---|---|---|
| 2,992,425 | 7/1961 | Pratt | 174/35 MS |
| 3,231,663 | 1/1966 | Schwartz | 174/35 MS |
| 4,379,098 | 4/1983 | Gumienny | 174/35 MS |
| 4,539,433 | 9/1985 | Ishino et al. | 174/35 MS |
| 4,542,076 | 9/1985 | Bednarz et al. | 174/35 R |
| 4,663,240 | 5/1987 | Hajdu et al. | 428/546 |
| 5,035,942 | 7/1991 | Nagata et al. | 428/288 |
| 5,155,316 | 10/1992 | Chiu | 174/35 MS |
| 5,244,708 | 9/1993 | Tsuchida et al. | 428/77 |
| 5,260,128 | 11/1993 | Ishii et al. | 428/328 |

FOREIGN PATENT DOCUMENTS 241098   9/1990   Japan .

*Primary Examiner*—Patrick J. Ryan
*Assistant Examiner*—Kam F. Lee
*Attorney, Agent, or Firm*—Fisher, Christen & Sabol

[57] ABSTRACT

An electromagnetic wave reflection-preventing material having a structure formed by successively laminating (A) an electromagnetic have reflecting metallic material layer, if needed, (B) a substrate layer, (C) a resin layer containing a powder of at least one selected from ferrite, carbon, metal powder and an electrically conductive metallic oxide, and, if needed, a good dielectric material, if needed, (D) a supporting film layer, and (E) a pattern coating layer prepared in the form of a geometrical pattern, containing a metal powder and having a volume resistivity of $10^{-3}$ to $10^{10}$ $\Omega$·cm, preferably further laminating (F) a clear or colored coating layer; and an electromagnetic wave reflection-preventing material which is obtained by substituting (G) a molded sheet layer formed by coating a coating composition prepared by dispersing the above powder into a binder onto a substrate having void, and molding under pressure for (C) a resin layer; and an electromagnetic wave reflection-preventing method which comprises applying the electromagnetic wave reflection-preventing material onto a structure, or which comprises applying a laminate obtained by removing the electromagnetic wave reflecting metallic material layer (A) from the electromagnetic wave reflection-preventing material onto an electromagnetic wave reflecting structure having a metallic surface.

10 Claims, 5 Drawing Sheets

ELECTROMAGNETIC WAVE REFLECTION-PREVENTING MATERIAL AND ELECTROMAGNETIC WAVE REFLECTION-PREVENTING METHOD

BACKGROUND OF THE INVENTION (1) Field of the Invention

This invention relates to an electromagnetic wave reflection-preventing material and electromagnetic wave reflection-preventing method which make it possible to prevent interference due to electromagnetic wave and to be of a thin-gage film and weight-saved.

(2) Description of the Prior Art

For the purpose of avoiding a malfunction of an electronic equipment by an electromagnetic wave, there have been proposed in the art a process which comprises coating an electrically-conduction coating composition onto a housing of the electronic equipment, an process which comprises forming a thin film of a metal such as zinc, alminium, iron and copper by plating, cladding, deposition, etc. onto a plastic substrate, and so forth. However, the above process coating the electrically-conductive coating composition onto the housing has such disadvantages that an electromagnetic wave shielding effect is poor and that the effect may be reduced with time. On the other hand, according to the above process forming the thin metal film onto the plastic substrate, the electromagnetic wave is reflected in such a large amounts that a secondary electromagnetic wave interference problem may be raised.

Japanese Patent Application Laid-open No. 241098/90 discloses an electromagnetic wave-shielding film formed by drawing a geometrical pattern onto a film by use of an electrically-conductive metal, and shows that the electromagnetic wave-shielding film has good shielding properties. The above films proposed in the art may effectively function as a shielding material for preventing a leakage of the electromagnetic wave generated from the electronic equipment, or preventing a malfunction of the electronic equipment due to the electromagnetic wave from outside, but may not effectively function for preventing an electromagnetic wave interference such as a false image of a radar due to a reflection of the electromagnetic wave, for example, by a bridge, a building, etc., or the like.

For the purpose of preventing the above interferences due to the reflection of the electromagnetic wave, there are known electromagnetic wave absorbent materials which are prepared by dispersing ferrite or a mixture of ferrite with metal powder or carbon powder into an organic polymer.

However, for the purpose of achieving a practically available absorbing characteristics by use of the above materials, it is necessary for the above materials to have a weight of 4 kg/m$^2$ or move and a film thickness of 1 mm or more even in the case of an electromagnetic wave having a narrow band frequency with an effective band width of 0.5 to 1 GHz exclusive, or to have a weight of about 12 kg/m$^2$ or move and a film thickness of 4.5 mm or more in the case of an electromagnetic wave having a broad band frequency with an effective band width of 1 to 5 GHz. Therefore, in use, the above electromagnetic wave absorbent material has such disadvantages that it is so heavy in weight and so thick in film thickness as to show poor application and working properties, that in the case where it is applied to building structures, etc., it is necessary to take strength and balance of the building structure as a whole into consideration, and so forth. Thus, it has been of a great demand to develop an electromagnetic wave reflection-preventing material which is of a thin-gage film and weight-saved so as to show good application and working properties, and has improved electromagnetic wave shielding power and electromagnetic wave reflection-preventing power.

SUMMARY OF THE INVENTION

It is an object of the present invention to provide an electromagnetic wave reflection-preventing material and an electromagnetic wave reflection-preventing method, which are capable of shielding the electromagnetic wave and showing an highly improved electromagnetic wave reflection-preventing power.

A first embodiment of the present invention provides an electromagnetic wave reflection-preventing material having a structure formed by successively laminating (A) an electromagnetic wave reflecting metallic material layer; if needed, (B) a substrate layer; (C) a resin layer containing a powder of at least one selected from ferrite, carbon, metal powder and an electrically conductive metallic oxide, and, if needed, a good dielectric material; if needed, (D) a supporting film layer; and (E) a pattern coating layer prepared in the form of a geometrical pattern, containing a metal powder and having a volume resistivity of $10^{-3}$ to $10^6$ $\Omega$·cm; preferably further laminating (F) a clear or colored coating layer: and an electromagnetic wave reflection-preventing method which comprises applying the electromagnetic wave reflection-preventing material onto a structure, or which comprises applying a laminate obtained by removing the electromagnetic wave reflecting metallic material layer (A) from the electromagnetic wave reflection-preventing material onto an electromagnetic wave reflecting structure having a metallic surface.

A second embodiment of the present invention provides an electromagnetic wave reflection-preventing material having a structure formed by successively laminating (A) an electromagnetic wave reflecting metallic material layer; (G) a molded sheet layer formed by coating a coating composition prepared by dispersing a powder of at least one selected from ferrite, carbon, metal powder and an electrically conductive metallic oxide, and, if needed, a good dielectric material into a binder, onto a substrate selected from a group consisting of a paper, cloth, nonwoven fabric and porous sheet, followed by molding under pressure; if needed, (D) a supporting film layer; and (E) a pattern coating layer prepared in the form of a geometrical pattern containing an metal powder and having a volume resistivity of $10^{-3}$ to $10^6$ $\Omega$·cm; preferably further laminating (F) a clear or colored coating layer: and an electromagnetic wave reflection-preventing method which comprises applying the electromagnetic wave reflection-preventing material onto a structure, or which comprises applying a laminate obtained by removing the electromagnetic wave reflecting metallic material layer (A) from the electromagnetic wave reflection-preventing material onto an electromagnetic wave reflecting structure having a metallic surface.

DETAILED DESCRIPTION OF THE INVENTION

Figure 1:
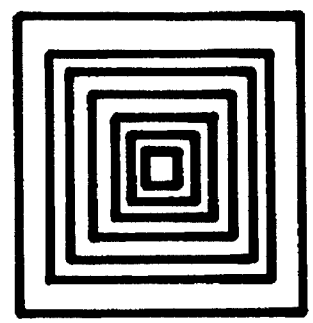
FIGS. 1–11 show examples of the pattern unit constituting the pattern coating layer (E) of the electromagnetic wave reflection-preventing material, in which the pattern unit is such a pattern that a plurality of band-shaped figures are combined so as not to contact with each other and to form a multi-figured structure, respectively.
Figure 2:
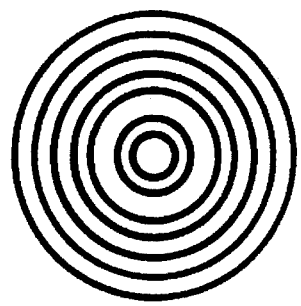

The electromagnetic wave reflecting metallic material layer (A) used in the electromagnetic wave reflection-preventing material of the present invention may include a metal layer which is capable of reflecting 100% to about 100%, i.e. about 99% or more of an incident electromagnetic wave, generally includes a metal sheet. The metal sheet may include a metal foil. Examples of the metal sheet may include sheets of metals such as tinplate, brass, duralumin, copper, iron, nickel, stainless sheet, aluminium and the like. The film thickness of the metal sheet may not particularly be limited, but is preferably in the range of 5 to 500 µm from the standpoints of strength and weight-saving.

According to the first embodiment of the present invention, the resin layer (C) is laminated directly or, if needed, through the substrate layer (B) onto the electromagnetic wave reflecting metallic material layer (A). The substrate layer (B) is used in the case where the resin layer (C) is laminated onto the substrate beforehand followed by adhering onto the layer (A). In the case where the resin layer (C) is laminated directly onto the layer (A), the substrate layer (B) is unnecessary. The substrate layer (B) may be a sheet having a strength to support the resin layer (C), and generally includes a plastic sheet having a film thickness of 10 to 500 µm. The plastic sheet may include a plastic film. Examples of the plastic sheet may include ones comprising resins such as polyamide, polyimide, polyethylene terephthalate, polyester, polyvinyl chloride, polyvinylidene chloride, Hypalon (chlorosulfonated polyethylene, trade name) rubber, chlorinated rubber, chloroprene rubber, epoxy resin, acrylic resin, phenolic resin and the like. The above plastic sheet may include a fiber-reinforced plastic sheet.

The resin layer (C) formed directly or through the substrate layer (B) onto the electromagnetic wave reflecting metallic material layer (A) is prepared by a process which comprises dispersing a powder of at least one selected from ferrite, carbon, metal powder and electrically conductive metallic oxide, and, if needed, a good dielectric material into a resin to form a dispersion, followed by molding the dispersion in the form of a sheet to be adhered onto the layer (A) or the layer (B) with an adhesive, or by coating the dispersion onto the layer (A) or the layer (B) to be dried.

Examples of the above resin may include polyimide, polyphenylene sulfide, rosin, shellac, ester rubber, Hypalon (chlorosulfonated polyethylene, trade name) rubber, chlorinated rubber, chloroprene rubber, polyolefin resin, hydrocarbon resin, vinylidene chloride resin, polyamide resin, polyether ketone resin, vinyl chloride resin, polyester resin, alkyd resin, phenolic resin, epoxy resin, acrylic resin, urethane resin, silicone resin, cellulose resin, vinyl acetate resin, and the like.

The ferrite to be dispersed into the resin may include ferrites conventionally used in the electromagnetic wave absorber, typically, for example, may include hematite ($Fe_2O_3$), magnetite ($Fe_3O_4$), iron oxides represented by the general formular: $MO.Fe_2O_3$ where M is Mn, Co, Ni, Cu, Zn, Ba, Mg, etc., and the like. The particle size of the ferrite may not particularly be limited, but preferably is 100 µm or less from the standpoints of dispersion properties, etc.

The carbon to be dispersed into the resin may preferably include carbons having an electrical conductivity, for example, electrically conductive carbon, carbon fiber, etc. A particle size of the carbon or a diameter of the carbon fiber may not particularly be limited, but preferably is 100 µm or less from the standpoints of dispersion properties, etc.

The metal powder to be dispersed into the resin may include one comprising gold, platinum, silver, copper, nickel, aluminium, iron or the like. The particle size of the metal powder may not particularly be limited, but preferably is 100 µm or less from the standpoints of dispersion properties, etc.

The electrically conductive metallic oxide to be dispersed into the resin may include metallic oxides having electric conductivity, for example, tin oxide and indium oxide. The above metallic oxide may be in the form of a particle or fiber, or may be in such a form that it may be formed as a thin film by deposition or the like onto a polymer powder or inorganic powder in the shape of a particle or fiber. A particle size of the particle or a diameter of the fiber may not particularly be limited, but may preferably be 100 µm or less from the standpoints of dispersion properties, etc.

The good dielectric material to be incorporated, if needed, in the resin may include, for example, titanate compounds such as barium titanate, strontium titanate, zirconium titanate, potassium titanate and the like in the form of a particle, whisker, etc., silicon carbide, silicon nitride, and the like. The above good dielectric material may be in the form of a particle or a fiber. A particle size of the particle or a diameter may not particularly be limited, but may preferably be 100 µm or less from the standpoints of dispersion properties, etc.

According to the first embodiment of the present invention, the powder of at least one selected from the ferrite, carbon, metal powder and electrically conductive metallic oxide may be used alone or in combination to be incorporated and dispersed into the resin. If needed, a good dielectric material may be incorporated into the above powder to be dispersed. An amount of the above powder per 100 parts by weight of the resin may preferably be in the following ranges respectively.

When the ferrite used alone, in the range of 100 to 200 parts by weight.

When either carbon, metal powder or electrically conductive metallic oxide used alone, or the mixture thereof used, in the range of 3 to 20 parts by weight.

When the mixture of ferrite with at least one of carbon, metal powder and electrically conductive metallic oxide used, in the range of 3 to 400 parts by weight in total, a total amount of the carbon and electrically conductive metallic oxide being less than 20 parts by weight.

When the mixture of ferrite and good dielectric material used, in the range of 100 to 400 parts by weight in total, an amount of the good dielectric material being preferably less than 50% by weight based on the total amount of the powder.

When the mixture of at least one of carbon, metal powder and electrically conductive metallic oxide with good dielectric material used, in the range of 3 to 200 parts by weight in total, a total amount of carbon, metal powder and electrically conductive metallic oxide being less than 20 parts by weight.

When the mixture of ferrite, at least one of carbon, metal powder and electrically conductive metallic oxide, and good dielectric material used, in the range of 3 to 400 parts by weight in total, a total amount of carbon, metal powder and electrically conductive metallic oxide being less than 20 parts by weight, an amount of good dielectric material being preferably less than 50% by weight based on a total amount of the powder.

When carbon, metal powder or electrically conductive metallic oxide is used, it is preferable to use in admixture with at least one of ferrite and good dielectric material. The use of ferrite alone or admixtures thereof with others is most preferable.

According to the second embodiment of the present invention, the molded sheet layer (G) laminated onto the electromagnetic wave reflecting metallic material layer (A) is formed by coating a coating composition prepared by dispersing a powder of at least one selected from ferrite, carbon, metal powder and electrically conductive metallic oxide, and, if needed, a good dielectric material into a binder, onto a paper, cloth, nonwoven fabric or porous sheet followed by molding under pressure.

The binder used in the coating composition may be the same as the resin used in the resin layer (C) of the first embodiment of the present invention.

The ferrite, the carbon, the metal powder, the electrically conductive metallic oxide or the good dielectric material to be dispersed into the binder may be the same as that used in the resin layer (C) of the first embodiment of the present invention, respectively. The amount of the powder to be incorporated into the binder may be the same as that in the resin layer (C) of the first embodiment of the present invention.

The above powder may be dispersed into the binder to obtain a coating composition. The above dispersion may be carried out by the known process, for example, a process which comprises, if needed, incorporating a solvent to dissolve or disperse the binder into the binder, followed by kneading and stirring.

The substrate, which comprises paper, cloth, nonwoven fabric or porous sheet and onto which the coating composition is coated, may not particularly be limited so long as it has a void and may be impregnated with the coating composition, preferably has a void content of 20 to 95% . Typical examples of the substrate may include cellulose based paper; cloth and nonwoven fabric obtained from fibers for example, synthetic fibers such as nylon fiber, polyester fiber, acrylic fiber, polyimide fiber and the like, carbon fiber, ceramic fibers such as titanate whisker, silicon carbide fiber and the like, natural fibers such as cotton yarn, flax, wool and the like; porous sheets such as a porous sintered material sheet comprising a ceramics obtained by sintering a mixture of an organic polymer with a ceramics, a foamed plastic sheet and the like; and the like. A thickness of the above substrate may not particularly be limited, but normally in the range of about 50 μm to about 3 mm.

The coating composition is coated onto the above substrate, followed by removing the solvent, if needed, by heating and molding under pressure to obtain the molded sheet layer (G). If needed, the molding may be carried out under heating, the above molding also results in impregnation of the substrate with the coating composition. In the case where the binder in the coating composition is thermosetting, the molding by heating under pressure may preferably be carried out at the so-called B stage.

The pressure of the molding may vary depending on a kind of the binder used and properties of the substrate, but generally is in the range of 50 to 500 kg/cm$^2$. The optional heating condition on molding may normally be in the range of room temperature to 250° C. A pressing time is normally in the range of one minute to 120 minutes. A thickness of the molded sheet layer (G) may not particularly be limited, but is normally about 50 μm to 3 mm, preferably 100 μm to 2 mm. An impregnation percentage of the coating composition for the substrate to be occupied by the solid content of the coating composition is preferably 20 to 95% by volume based on the volume of the substrate including the void. The coating composition may be coated onto the substrate in such a coating weight that the thickness of the molded sheet layer (G) may be normally about 50 μm to 3 mm, preferably 100 μm to 2 mm.

According to the molded sheet layer (G), the coating composition is coated onto the substrate, followed by pressing to be molded in the form of a sheet, resulting in that the powdery particles in the coating composition is densely packed to provide the same or improved effect in a lighter weight and thinner film compared with the case where the pressure molding is deleted.

According to the first embodiment of the present invention, the function and effect of the resin layer (C) are not cleared, but it is considered that the resin layer (C) may function to vary a traveling path length of an electromagnetic wave which has entered inside through an area not occupied by a coating of the pattern coating layer and to vary a phase of an electromagnetic wave which reflects on the layer (A) and leaves through the area not occupied by the coating of the pattern coating layer outside, and that an interference between an electromagnetic wave reflected on the coating of the pattern coating layer and the above electromagnetic wave having been varied in phase provides an effect to disappear energy of the electromagnetic wave.

The function and effect of the molded sheet layer (G) in the second embodiment of the present invention may be the same as those of the resin layer (C) in the first embodiment of the present invention.

According to the electromagnetic wave reflection-preventing material in the first and second embodiments of the present invention, a pattern coating layer (E) is laminated directly or through a supporting film layer (D) onto the resin layer (C) or the molded sheet layer (G).

The pattern coating layer (E), is a coating containing metal powder and in the form of a geometrical pattern, and having a volume resistivity of $10^{-3}$ to $10^6$ Ω·cm, preferably $10^{-3}$ to $10^2$ Ω·cm.

The pattern coating layer (E) may be prepared by coating a coating composition or ink formulated by incorporating metal powder, if needed, a solvent, an antisagging agent, a defoamer, a pigment dispersant, other coating additives, etc. into the resin onto the resin layer (C) or the supporting film layer (D) in the form of a geometrical pattern in the first embodiments of the present invention by the conventional process such as the gravure printing, the spray coating process, the roll coater process and the like, so that the resulting coating layer may have a volume resistivity of $10^{-3}$ to $10^6$ Ω·cm, followed by drying.

According to the electromagnetic wave reflection-preventing material in the second embodiment of the present invention, a pattern coating layer (E) is laminated directly or through the supporting film layer (D) onto the molded sheet layer (G).

The above pattern coating layer (E) may be prepared by coating the same coating composition or ink as in the first embodiment of the present invention onto the molded sheet layer (G) or the supporting film layer (D) in the form of a geometrical pattern by the conventional process as in the first embodiment of the present invention, so that the resulting coating layer may have a volume resistivity of $10^{-3}$ to $10^6$ $\Omega\cdot$cm, followed by drying.

The supporting layer (D) used in the present invention may include a sheet having a strength to support the pattern coating layer (E), generally includes a plastic sheet having a film thickness of 10 to 500 μm. The plastic sheet may include a plastic film. Examples of the resins constituting the plastic sheet may include polyimide, polyethylene terephthalate, polyvinyl chloride, polyvinylidene chloride, Hypalon rubber, chlorinated rubber, chloroprene rubber, epoxy resin, acrylic resin, phenolic resin, and the like. The above plastic sheet may include a fiber-reinforced plastic sheet.

According to the first embodiment of the present invention, the pattern coating layer (E) may be formed onto the supporting film layer (D) by a process which comprises adhering a supporting film onto the resin layer (C) by use of an adhesive, followed by forming the pattern coating layer (E) thereonto, or a process which comprises forming the pattern coating layer (E) onto a supporting film itself, followed by adhering the resulting pattern coating layer (E) with the supporting film onto the resin layer (C). When the pattern coating layer (E) is formed directly onto the resin layer (C), the supporting film layer (D) is unnecessary.

According to the second embodiment of the present invention, the pattern coating layer (E) may be formed onto the supporting film (D) by a process which comprises adhering a supporting film onto the molded sheet layer (G) by use of an adhesive, followed by forming the pattern coating layer (E) thereonto, or a process which comprises forming the pattern coating layer (E) onto a supporting film itself, followed by adhering the resulting pattern coating layer (E) with the supporting film onto the molded sheet layer (G). When the pattern coating layer (E) is formed directly onto the molded sheet layer (G), the supporting film layer (D) is unnecessary.

Examples of the metal powder incorporated into the coating composition used in forming the pattern coating layer (E) may include powders of metals such as gold, platinum, silver, nickel, aluminium, copper, iron, cobalt, zinc, tungsten and the like. The particle size and amount of the metal powder are not particularly limited, but the particle size is preferably 100 μm or less from the standpoint of dispersion properties, and the amount thereof is preferably 25 to 500 parts by weight per 100 parts by weight of the solid content of the resin.

The resin incorporated into the coating composition used in forming the pattern coating layer (E) may include film-forming resins, i.e. film-forming resins conventionally used in the field of coating composition and ink, for example, resins to be used in the resin layer (C) or binders for use in coating composition to be used in the molded sheet layer (G). If needed, a curing agent to react with a functional group in the resin for curing may also be incorporated thereinto.

The solvent incorporated, if needed, into the coating composition may include one capable of dissolving or dispersing the resin used in the coating composition and is used to control the viscosity of the coating composition or ink and to improve coating workability.

According to the present invention, a shape of the pattern coating layer (E) may be a geometrical pattern, for example, checkered pattern, lattice pattern, stripe pattern, triangle, quadrangle, pentagon, hexagon, circle, polka dotted pattern, etc. The pattern preferably has an uncoated area to coated area ratio of 0.05 to 20, more preferably 0.1 to 10, and most preferably 0.1 to 4. A size of each figure constituting the pattern is such that each side length in the lattice, a space between lines in the stripe, a diagonal or subtense distance in the polygon, diameter in the circle, etc. may preferable be 30 mm or less respectively.

A pattern in a first embodiment of the geometrical pattern may preferably be such that a plurality of band-shaped figures are combined so as not to contact with each other and to form a multi-figured structure as a pattern unit, and a plurality of pattern units are arranged to form the pattern (hereinafter may be referred to as a first specific pattern).

Each band-shaped figure constituting the first specific pattern is not particularly limited in shape so long as it is band-shaped, but preferably has a width of 0.01 to 5 mm and a ratio of an arithmetic mean of its length to an arithmetic mean of its width in the range of 3:1 to $10^6$:1. A space between bands of adjacent figures in the pattern unit is preferably in the range of 0.01 to 10 mm, more preferably 0.05 mm to 5 mm. The spaces may be at regular intervals or at irregular intervals. Respective figures may or may not be in the analogous shape, but the above range of the space between bands in the pattern unit is preferred from the standpoint of the electromagnetic wave reflection-preventing power. A combination of figures in the analogous shape makes it easy to keep the above space within a predetermined range. Respective figures may be a closed ring-shaped figure having no open end or an open ring-shaped figure having an open end.

The multi-figured structure as the pattern unit may include ones obtained by arranging respective figures so as to form a multi-figured structure, for example, forming the stripe pattern, concentrically arranging circles different in size from each other, concentrically arranging analogous polygons different in size from each other, and the like. A size of the pattern unit is preferably 1,000 cm$^2$ or less, and a longest distance between arbitrary two points in the pattern unit is more preferably 30 mm or less.

The typical examples of the pattern unit are shown in FIGS. 1–11.

Figure 7:
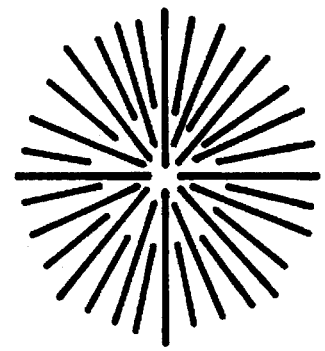
Figure 8:
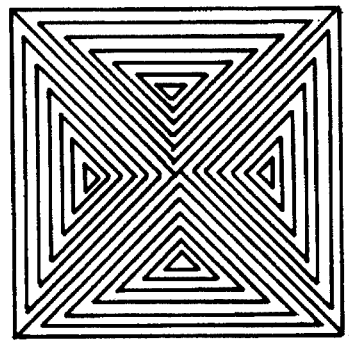
Figure 9:
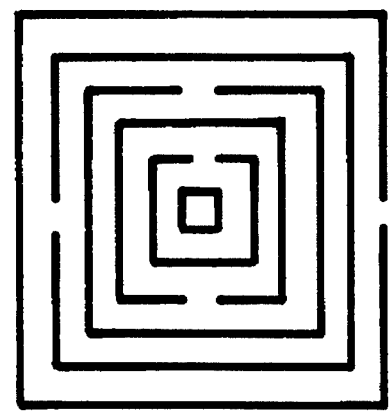
Figure 10:
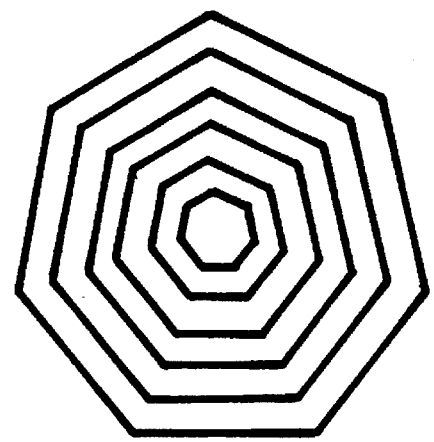
Figure 11:
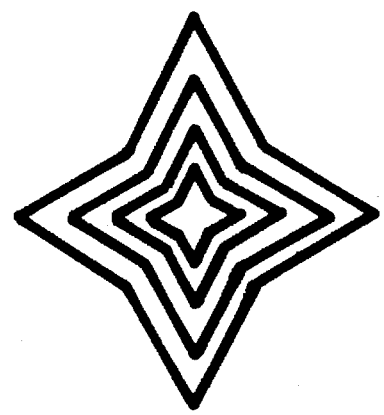

The multi-figured structure as the pattern unit is not limited to ones shown in the above drawings. For example, in FIG. 1, a number of figures to be combined so as to form the pattern unit may arbitrarily be changed depending on the size of the pattern unit, width of the band, space between bands, etc. In FIG. 7, a number of a sequent or band used in a segment pattern unit may arbitrarily be changed.

A pattern in a second embodiment of the geometrical pattern may preferably be such that a pattern unit is formed by a continuous band-shaped figure, and a plurality of pattern units are arranged to form the pattern (hereinafter may be referred to as a second specific pattern).

The continuous band-shaped figure as the pattern unit in the second specific pattern is not particulary limited in shape so long as it is band-shapd and continuous, but preferably has a width of 0.01 to 5 mm and a ratio of an arithmatic mean of its length to an arithmatic mean of its width in the range of 3:1 to $10^6$:1.

A typical figure as the pattern unit in the second specific pattern is a spiral figure. In the spiral figure, the space between inner band and outer band adjacent to the inner band is preferably in the range of 0.01 to 10 mm, more preferably 0.05 to 5 mm. The space may be at regular intervals or at irregular intervals, but regular intervals are preferred from the standpoint of the electromagnetic wave reflection-preventing power. A size of the pattern unit of the second specific pattern is preferably 1,000 cm$^2$ or less, and a longest distance between arbitrary two points in the pattern unit is more preferably 30 mm or less. The typical examples of the pattern unit are shown in FIGS. 13–17.

The continuous band-shaped figure as the pattern unit is not limited to ones shown in the above drawings. For example, the size of pattern unit, width of the band, space between inner band and outer band, spiral number, etc. may arbitrarily be changed.

A plurality of pattern units may be arranged so as to form the pattern coating layer (E). The arrangement of the pattern unit may be made to form, for example, the checkered pattern, stripe pattern, lattice pattern, etc., preferably in the form of a predetermined repeating pattern.

The electromagnetic wave reflection-preventing material of the present invention may be prepared by successively laminating the electromagnetic wave reflecting metallic material layer (A), if needed, the substrate layer (B), the resin layer (C), if needed, the supporting film layer (D) and the pattern coating layer (E) in the first embodiment of the present invention, or successively laminating the electromagnetic wave reflecting metallic material layer (A), the molded sheet layer (G), if needed, the supporting film layer (D) and the pattern coating layer (E) in the second embodiment of the present invention.

For the purpose of the improvement of the electromagnetic wave reflection-preventing material in corrosion resistance, weather resistance, appearance, maintenance of material characterics, etc., a clear or colored coating layer (F) may be laminated onto the pattern coating layer (E). Examples of the resin constituting the coating layer (F) may include epoxy resin, urethane resin, acrylic resin, polyester resin, and the like.

The electromagnetic wave reflection-preventing method of the present invention comprises applying the electromagnetic wave reflection-preventing material of the present invention onto a structure to shield electromagnetic wave and to prevent reflection of electromagnetic wave by adhering the electromagnetic wave reflection-preventing material onto the structure by use of an adhesive or the like, and makes it possible to effectively shield electromagnetic wave and prevent reflection of electromagnetic wave.

In the case where the above structure to shield electromagnetic wave and to prevent reflection of electromagnetic wave is an electromagnetic wave reflecting structure having a metallic surface, the electromagnetic wave reflecting structure may function like the electromagnetic wave reflecting metallic material layer (A) of the present invention to shield electromagnetic wave and so forth. In the above case, another embodiment of the electromagnetic wave reflection-preventing method of the present invention which comprises applying a laminate obtained by removing the electromagnetic wave reflecting metallic material layer (A) from the electromagnetic wave reflection-preventing material onto the electromagnetic wave reflecting structure having the metallic surface, makes it possible to effectively prevent reflection of electromagnetic wave.

An adhering agent may be coated beforehand on the surface of the electromagnetic wave reflecting metallic material layer (A) of the electromagnetic wave reflection-preventing material of the present invention in the opposite side to the layer (C) or the layer (G), a release sheet may be laminated thereon, and the release sheet may then be separated for simply adhering to the structure in sites to be form an electromagnetic wave reflection-preventing material onto the structure.

As evident from the results of Examples 1–6, 8–9, and 11–18, the electromagnetic wave reflection-preventing material of the present invention shows extremely low electromagnetic wave reflectances in spite of being thin in thickness and light in weight, and shows a wide effective absorption area. As evident from the results of Comparative Example 1, use of substantially only the pattern coating layer (E) of the present invention shows a very high electromagnetic wave reflectance and provides little effect of absorbing electromagnetic wave. As evident from the results of Comparative Example 2, use of substantially only the ferrite-containing resin layer makes it necessary to use a thick laminate so that a low electromagnetic wave reflectance may be obtained, and shows a narrow effective absorption area.

It is considered from the above results that the electromagnetic wave reflection-preventing material provides excellent electromagnetic wave reflection-preventing effect as the results of mutual, unexpected, special wave interference or wave energy negation with one another due to a combination of the pattern coating layer (E), the resin layer (C) or the molded sheet layer (G) and the electromagnetic wave reflecting metallic material layer (A).

In Comparative Example 3, the procedures of Example 8 were repeated except that the step of pressing was deleted on preparing the molded sheet layer (G), and comparison of the results of Example 8 with that of Comparative Example 3 shows that the former provides an improved electromagnetic wave reflection-preventing effect, and shows that it is effective to fill the coating composition by pressing.

The results of Examples 7, 10 and 19 as the examples of the electromagnetic wave reflection-preventing method comprising applying a laminate obtained by removing the electromagnetic wave reflecting metallic material layer (A) from the electromagnetic wave reflection-preventing material onto an electromagnetic wave reflecting structure having a metallic surface show excellent electromagnetic wave reflection-preventing effect.

The present invention will be explained more in detail by the following Examples and Comparative Examples, in which "part" means "part by weight".

EXAMPLE 1

A coating composition containing 200 parts of barium based ferrite per 100 parts of acrylic resin was coated to be a dry film thickness of 500 μm onto a polyimide film layer (B) having a thickness of 50 μm to form a resin layer (C). Separately, a pattern coating layer (E) having a dry film thickness of 50 μm, having a volume resistivity of $3.1 \times 10^{-3}$ Ω·cm, and having a 15 mm square checkered pattern formed by use of an electrically conductive ink containing 200 parts of nickel powder per 100 parts of acrylic resin was formed onto a polyimide film layer (D) having a thickness of 50 μm. A thermocompression bonding sheet was inserted between a stainless steel foil layer (A) having a thickness of 50 μm and the above layer (B) as well as between the above layer (C) and the above layer (D) respectively, followed by pressing while heating at 180° C. to obtain an electromagnetic wave reflection-preventing material.

EXAMPLE 2

A coating composition containing 150 parts of nickel based ferrite per 100 parts of epoxy resin was coated to be a dry film thickness of 500 μm onto an aluminium foil layer (A) having a thickness of 100 μm to obtain a resin layer (C).

Onto the above layer (C) were printed circles having a diameter of 5 mm by use of an electrically conductive ink containing 100 parts of leafing type nickel powder per 100 parts of acrylic resin in such a row as to be at an interval of 10 mm between centers of the circles to form a first row, followed by printing in the same manner as in the first row except that a center of the circle is shifted downward by 5 mm and to the right by 5 mm to form a second row, repeating the same printing as in the first row to form a third row, repeating the same printing as in the second row to form a fourth row, and successively repeating the above repeating unit to form a pattern coating layer (E) having a dry film thickness of 50 μm and a volume resistivity of $5.3 \times 10^{-1}$ Ω·cm, and to obtain an electromagnetic wave reflection-preventing material.

EXAMPLE 3

A coating composition containing 100 parts of barium based ferrite and 10 parts of electrically conductive carbon per 100 parts of acrylic resin was coated to be a dry film thickness of 350 μm onto a polyimide film layer (B) having a thickness of 50 μm to form a resin layer (C). Onto the above layer (C) was printed an electrically conductive ink containing 80 parts of nickel powder per 100 parts of acrylic resin in the same pattern as in Example 1 to form a pattern coating layer (E) having a dry film thickness of 30 μm and a volume resistivity of 9.8 Ω·cm.

The above layer (B) of a resulting laminate consisting of the above layers (B), (C) and (E) was adhered onto a stainless steel foil layer (A) having a thickness of 50 μm by use of an adhesive to obtain an electromagnetic wave reflection-preventing material.

EXAMPLE 4

A coating composition containing 10 parts of an electrically conductive carbon and 70 parts of barium titanate powder per 100 parts of acrylic resin was coated to be a dry film thickness of 800 μm onto a glass fiber-reinforced sheet layer (B) impregnated with epoxy resin and having a thickness of 100 μm to form a resin layer (C). Separately, onto a glass fiber-reinforcing sheet layer (D) having a thickness of 100 μm were printed regular octagons having a side of 5 mm by use of an electrically conductive ink containing 300 parts of nickel powder and 10 parts of an electrically conductive carbon per 100 parts of acrylic resin in such a row as to be at an interval of 21 mm between centers thereof to form a first row, followed by printing regular squares having a side of 5 mm in the same manner as in the first row except that a center of the regular square is shifted downward by 10.5 mm and to the right by 10.5 mm to form a second row, repeating the same printing as in the first row to form a third row, repeating the same printing as in the second row to form a fourth row, and successively repeating the above repeating unit to form a pattern coating layer (E) having a dry film thickness of 35 μm and a volume resistivity of $1.6 \times 10^{-3}$ Ω·cm. A thermocompression bonding sheet was inserted between a copper foil layer (A) having a thickness of 50 μm and the above layer (B) as well as between the above layer (C) and the above layer (D) respectively, followed by pressing while heating at 180° C. to obtain an electromagnetic wave reflection-preventing material.

EXAMPLE 5

A coating composition containing 175 parts of barium based ferrite and 25 parts of potassium titanate whisker per 100 parts of acrylic resin was coated to be a dry film thickness of 350 μm onto a polyimide film layer (B) having a thickness of 50 μm to form a resin layer (C). Onto the above layer (C) was printed an electrically conductive ink containing 200 parts of an electrolytic copper powder per 100 parts of acrylic resin in the same pattern as in Example 1 to form a pattern coating layer (E) having a dry film thickness of 30 μm and a volume resistivity of $5.7 \times 10^{-3}$ Ω·cm.

The above layer (B) of a resulting laminate consisting of the above layers (B), (C) and (E) was adhered onto a stainless steel foil layer (A) having a thickness of 50 μm by use of an adhesive to obtain an electromagnetic wave reflection-preventing material.

EXAMPLE 6

A coating composition containing 150 parts of barium based ferrite, 5 parts of an electrically conductive carbon and 50 parts of strontium titanate powder per 100 parts of acrylic resin was coated to be a dry film thickness of 300 μm onto a polyimide film layer (B) having a thickness of 50 μm to form a resin layer (C). Onto the above layer (C) was printed an electrically conductive ink containing 200 parts of an electrolytic copper powder per 100 parts of acrylic resin in the same pattern as in Example 1 to form a pattern coating layer (E) having a dry film thickness of 30 μm and a volume resistivity of $5.7 \times 10^{-3}$ Ω·cm.

The above layer (B) of a resulting laminate consisting of the above layers (B), (C) and (E) was adhered onto a stainless steel foil layer (A) having a thickness of 50 μm by use of an adhesive to obtain an electromagnetic wave reflection-preventing material.

EXAMPLE 7

Experiments in Example 3 were repeated except that a steel pole of 300 mm×300 mm×1000 mm as a structure having a metallic surface was used in place of the stainless steel foil layer (A) in Example 3 to obtain an electromagnetic wave reflection-preventing structure.

COMPARATIVE EXAMPLE 1

The laminate consisting of the layer (D) and the pattern coating layer (E) used in Example 1, that is, the laminate obtained by forming the pattern coating layer (E) in the checkered pattern by use of the electrically conductive ink onto the polyimode film layer (D), was taken as Comparative Example 1.

COMPARATIVE EXAMPLE 2

Onto a polyimide film layer (B) having a thickness of 50 μm was coated and dried a coating composition containing 200 parts of barium based ferrite per 100 parts of acrylic resin to be a dry film thickness of 3 mm to obtain a laminate consisting of the above layer (B) and the ferrite-containing resin layer formed thereon as Comparative Example 2.

EXAMPLE 8

Onto a nonwoven fabric consisting of silicon carbide whisker and having a thickness of 120 μm was coated a coating composition containing 200 parts of a barium based ferrite per 100 parts of acrylic resin so that a dry film thickness may be 300 μm when coated onto a smooth metallic surface, followed by heating at 80° C. for 60 minutes to evaporate the solvent contained in the coating composition, and molding under the conditions of a temperature of 140° C. and a pressure of 200 kg/cm² for 60 minutes to obtain a molded sheet layer (G) having a thickness of about 350 μm. Separately, a pattern coating layer (E) having a dry film thickness of 50 μm, having a volume resistivity of $3.1 \times 10^3$ Ω·cm and having a 15 mm square checkered pattern formed by use of an electrically conductive ink containing 200 parts of nickel powder per 100 parts of acrylic resin was formed onto a polyimide film layer (D) having a thickness of 50 μm. A thermocompression bonding sheet was inserted between a stainless steel foil layer (A) having a thickness of 50 μm and the above layer (G) as well as between the above layer (G) and the above layer (D) respectively, followed by pressing and laminating at 180° C. to obtain an electromagnetic wave reflection-preventing material.

EXAMPLE 9

Onto a nonwoven fabric consisting of an aramid fiber and having a thickness of 100 μm was coated a coating composition containing 10 parts of an electrically conductive carbon and 70 parts of a barium titanate powder per 105 parts of a mixture of 100 parts of Epikote 828 (bisphenol A type epoxy resin, trade name, marketed by Shell Chemical Co., Ltd.) with 5 parts of diethylenetetramine as a curing agent so that a dry film thickness may be 500 μm when coated onto a smooth metallic surface, followed by having to stand at room temperature for 20 minutes, heating at 100° C. under a pressure of 150 kg/cm² for 10 minutes, and further heating at 130° C. for 20 minutes for molding to obtain a molded sheet layer (G) having a thickness of about 520 μm. Separately, onto a polyethylene terephtharate layer (D) having a thickness of 50 μm were printed regular octagons having a side of 5 mm and regular squrres having a side of 5 mm by use of an electrically conductive ink containing 100 parts of nickel powder and 10 parts of an electrically conductive carbon per 100 parts of acrylic resin in the same pattern as that of the pattern coating layer (E) in Example 4 to form a pattern coating layer (E) having a dry film thickness of 30 μm and a volume resistivity of 7.2 Ω·cm. A thermocompression bonding sheet was inserted between an aluminium foil layer (A) having a thickness of 50 μm and the above layer (G) as well as between the above layer (G) and the above layer (D) respectively, followed by pressing and laminating at 180° C. to obtain an electromagnetic wave reflection-preventing material.

EXAMPLE 10

Experiments in Example 8 were repeated except that a steel pole of 300 mm×300 mm×1000 mm as a structure having a metallic surface was used in place of the aluminium foil layer (A) in Example 8 to obtain an electromagnetic wave reflection-preventing structure.

EXAMPLE 11

Onto a nonwoven fabric consisting of an aramid fiber and having a thickness of 100 μm was coated a coating composition containing 150 parts of a barium based ferrite, 5 parts of nickel powder and 25 parts of potassium titanate whisker per 105 parts of a mixture of 100 parts of Epikote 828 with 5 parts of diethylenetetramine as a curring agent so that a dry film thickness may be 250 μm when coated onto a smooth metallic surface, followed by leaving to stand at room temperature for 20 minutes, and heating at 120° C. for 20 minutes under a pressure of 100 kg/cm² to obtain a molded sheet layer (G) having a thickness of about 280μm. Onto the above molded sheet layer (G) was printed an electrically conductive ink containing 200 parts of an electrolytic copper per 100 parts of acrylic resin in the same pattern as in Example 8 to obtain a pattern coating layer (E) having a dry film thickness of 30 μm and a volume resistivity of $5.7 \times 10^{-3}$ Ω·cm.

Onto an aluminium foil layer (A) was adhered the resulting laminate by use of an adhesive so that the surface of the layer (G) may be contacted with the surface of the layer (A) to obtain an electromagnetic wave reflection-preventing material.

EXAMPLE 12

Onto a nonwoven fabric consisting of a potassium titanate whisker and having a thickness of about 150 μm was coated a coating composition containing 15 parts of powders prepared by coating barium salfate powder with an indium-tin oxide to a thickness of about 100 nm by spattering, 100 parts of a barium based ferrite and 50 parts of strontium titanate powder per 100 parts of acrylic resin so that a dry film thickness may be 200 μm when coated onto a smooth metallic surface, followed by drying at 80° C for 60 minutes, and heating and molding at 150° C. under a pressure of 80 kg/cm² for 3 hours to obtain a molded sheet layer (G) having a thickness of about 325 μm.

Onto the above molded sheet layer (G) was printed an electrically conductive ink containing 200 parts of an electrolytic copper powder per 100 parts of acrylic resin in the same pattern as in Example 8 to form a pattern coating layer (E) having a dry film thickness of 30 μm and a volume resistivity of $5.7 \times 10^{-3}$ Ω·cm, and onto the above layer (E) was coated a thermosetting acrylic resin clear coating to be a dry film thickness of 50μm, followed by curing at 120° C. for 30 minutes to obtain a laminate.

Onto an aluminium foil layer (A) having a thickness of 50 μm was adhered the resulting laminate by use of an adhesive so that the surface of the layer (G) may be contacted with the surface of the layer (A) to obtain an electromagnetic wave reflection-preventing material.

COMPARATIVE EXAMPLE 3

Experiments of Example 8 were repeated except that a step of pressing under pressure was deleted on forming the mold sheet layer (G) in Example 8 to obtain a comparative electromagnetic wave reflection-preventing material.

EXAMPLE 13

Onto a polyimide film layer (B) having a thickness of 80 μm was coated a coating composition containing 200 parts of a barium based ferrite per 100 parts of acrylic resin to a dry film thickness of 500 μm to form a resin layer (C). Separately, onto a polyimide film layer (D) having a thickness of 50 μm was printed an electrically conductive ink containing 200 parts of nickel powder per 100 parts of acrylic resin so that such a pattern unit that an outermost figure has a side of about 20 mm, that a band has a width of about 250 μm, and that a space between bands is about 250 μm as shown in FIG. 1 may be arranged to be spaced upward and downward by 1 mm and spaced from side to side by 1 mm to form a pattern coating layer (E) having a thickness of about 35 μm and a volume resistivity of $3.1 \times 10^{-3}$ Ω·cm. Next, by using the resulting two laminates, an aluminium foil layer (A) having a thickness of 50 μm was adhered onto the layer (B), and the layer (C) was adhered onto the layer (D) respectively by use of an adhesive to obtain an electromagnetic wave reflection-preventing material.

EXAMPLE 14

Onto an aluminium foil layer (A) having a thickness of 50 μm was coated and dried to be a dry film thickness of about 500 μm a coating composition containing 50 parts of a nickel based ferrite, and 10 parts of powders prepared by coating barium sulfate powders with an indium-tin oxide film to a thickness of about 10 nm by spattering per 105 parts of a mixture of 100 parts of Epikote 828 (bisphenol A type epoxy resin, trade name, marketed by Shell Chemical Co., Ltd.) with 5 parts of diethylenetetramine as a curing agent to form a resin layer (C).

Figure 3:
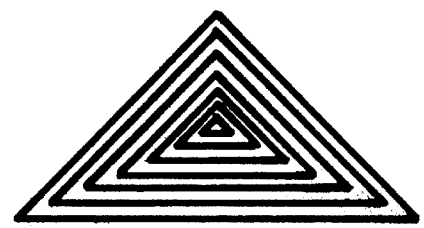
Figure 4:
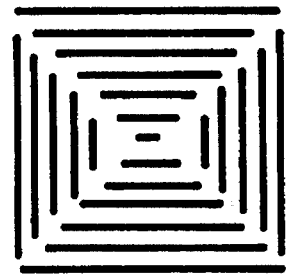
Figure 5:
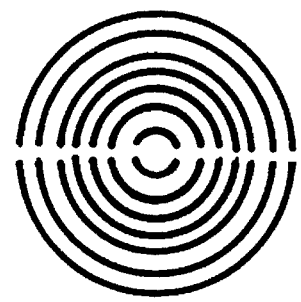
Figure 6:
Figure 12:
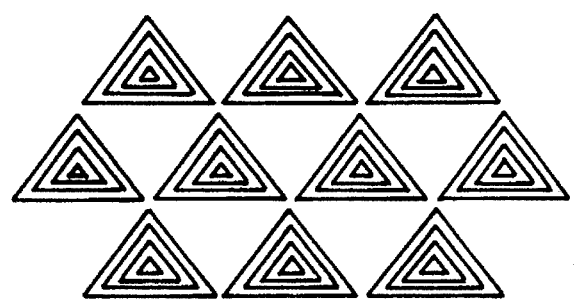
FIG. 12 shows an example of an arrangement of a pattern unit shown in FIG. 3 and constituting the pattern coating layer (E) of the electromagnetic wave reflection-preventing material in the present invention.

Onto the above resin layer (C) was arranged and printed a pattern unit shown in FIG. 3 and having a shape of a triangle, a longest side length of about 12 mm in the outermost triangle, a line width of 100 μm and a line space of 100 μm by use of an electrically conductive ink containing 150 parts of nickel powder per 100 parts of acrylic resin in an arranged pattern as shown in FIG. 12 so that a distance between apexes of respective pattern units may be 0.5 mm respectively to form a pattern coating layer (E) having a thickness of about 50 μm and a volume resistivity of $2.3 \times 10^{-1}$ Ω·cm and to obtain an electromagnetic wave reflection-preventing material.

EXAMPLE 15

Onto a polyimide film layer (B) having a thickness of 50 μm was coated a coating composition containing 100 parts of barium based ferrite and 10 parts of an electrically conductive carbon per 100 parts of acrylic resin so that a dry film thickness may be 400 μm to form a resin layer (C). Onto the above layer (C) was arranged and printed a pattern unit shown in FIG. 7 and having a longest band length of 15 mm, a line width of 200 μm and 32 segmental bands per one pattern unit by use of an electrically conductive ink containing 100 parts of nickel powder per 100 parts of acrylic resin in such an arranged pattern that a space between respective pattern units may be 5 mm upward and downward, and from side to side respectively to form a pattern coating layer (E) having a thickness of about 60 μm and a volume resistivity of 7.5 Ω·cm. Onto an aluminium foil layer (A) having a thickness of 50 μm was adhered the layer (B) of the above resulting laminate by use of an adhesive to obtain an electromagnetic wave reflection-preventing material.

EXAMPLE 16

Onto a nonwoven fabric consisting of an aramid fiber having a thickness of about 100 μm was coated a coating composition containing 10 parts of an electrically conductive carbon and 150 parts of barium titanate powder per 105 parts of a mixture of 100 parts of Epikote 828 with 5 parts of diethylenetetramine as a curing agent so that a dry film thickness may be 600 μm when coated onto a smooth metallic surface, followed by heating at 80° C. for 10 minutes, and pressing under a pressure of 200 kg/cm² for 60 minutes while heating at 100° C. to form a molded sheet having a thickness of about 680 μm as a resin layer (C). Separately, onto an epoxy resin-impregnated glass fiber reinforced sheet layer (D) having a thickness of 100 μm was arranged and printed a pattern unit shown in FIG. 9 and having a longest side length of about 7 mm in an outermost partly-cut regular square, a line width of 300 μm and a line space of 75 μm by use of an electrically conductive ink containing 300 parts of nickel powder and 10 parts of an electrically conductive carbon per 100 parts of acrylic resin in such an arranged pattern that a distance between apexes of respective pattern units may be 0.5 mm forming a checkered pattern to form a pattern coating layer (E) having a thickness of about 35 μm and a volume respectivity of $1.6 \times 10^{-3}$ Ω·cm. A thermocompression bonding sheet was inserted between an aluminium foil layer (A) having a thickness of 50 μm and the above layer (C) as well as between the above layer (C) and the above layer (D) respectively, followed by pressing while heating at 180° C. to obtain an electromagnetic wave reflection-preventing material.

EXAMPLE 17

Onto a polyimide film layer (B) having a thickness of 50 μm was coated a coating composition containing 175 parts of barium based ferrite and 25 parts of potassium titanate whisker per 100 parts of acrylic resin so that a dry film thickness may be 350 μm to form a resin layer (C). Onto the above resin layer (C) was arranged and printed a pattern unit shown in FIG. 11 and having a side length of about 5 mm in the outermost figure, a line width of 500 μm and a line space of 250 μm by use of an electrically conductive ink containing 200 parts of an electrolytic copper per 105 parts of a mixture of 100 parts of Epikote and 5 parts of diethylenetetramine as a curing agent in such an arranged pattern that respective apexes of four acute angles in an outermost figure are spaced by 0.3 mm from one of four apexes of respective pattern units adjacent thereto upward and downward, and from side to side respectively to form a pattern coating layer (E) having a dry film thickness of 30 μm and a volume resistivity of $5.7 \times 10^{-3}$ Ω·cm. Further, onto the above layer (E) was formed a two-pack type urethane clear coating layer (F) having a dry film thickness of 50 μm.

Onto an aluminium foil layer (A) having a thickness of 50 μm was adhered the layer (B) of the resulting laminate by use of an adhesive to obtain an electromagnetic wave reflection-preventing material.

EXAMPLE 18

Onto a polyimide film layer (B) having a thickness of 50 μm was coated a coating composition containing 150 parts of barium based ferrite, 5 parts of an electrically conductive carbon and 50 parts of strontium titanate powder per 100 parts of acrylic resin so that a dry film thickness may be 300 μm to form a resin layer (C). Onto the resin layer (C), was printed an electrically conductive ink containing 200 parts of an electrolytic copper per 100 parts of acrylic resin in the same pattern as in Example 13 to form a pattern coating layer (E) having a dry film thickness of 30 μm and a volume resistivity of $5.7 \times 10^{-3}$ Ω·cm.

Onto a duralumin foil layer (A) was adhered the layer (B) of the above laminate by use of an adhesive to obtain an electromagnetic wave reflection-preventing material.

EXAMPLE 19

Experiments of Examples 15 were repeated except that a steel pole of 300 mm×300 mm×1000 mm as a structure having a metallic surface was used in place of the aluminium foil layer (A) in Example 15 to obtain an electromagnetic wave reflection-preventing structure.

EXAMPLE 20

Figure 13:
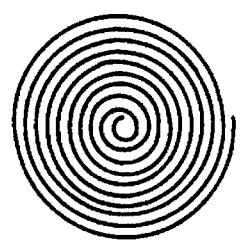
FIGS. 13–17 show examples of the pattern unit constituting the pattern coating layer (E) of the electromagnetic wave reflection-preventing material, in which the pattern unit is formed by a continuous band-shaped figure.
Figure 14:
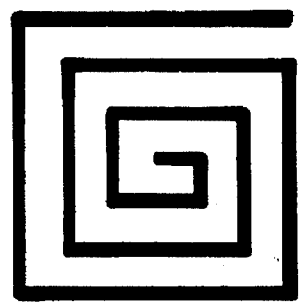
Figure 18:
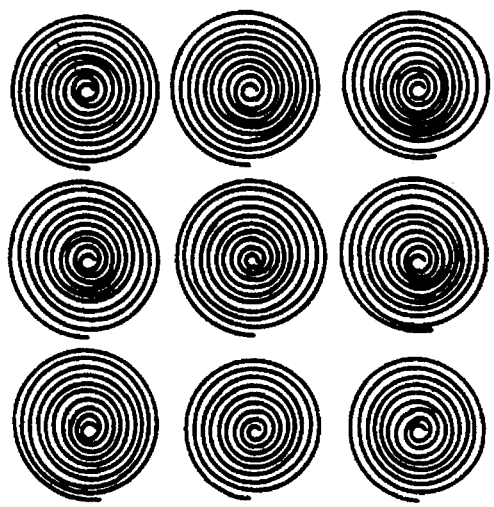
FIG. 18 shows an example of an arrangement of a pattern unit shown in FIG. 13 and constituting the pattern coating layer (E) of the electromagnetic wave reflection-preventing material.

Experiments of Examples 13 were repeated to obtain an electromagnetic wave reflection-preventing material except that a pattern used in the pattern coating layer (E) is formed by arranging a spiral pattern unit shown in FIG. 13 and having a diameter of an outermost circular arc of 20 mm, a band width of about 250 μm and a space between bands of about 250 μm so as to be spaced upward and downward by 1 mm and spaced from side to side by 1 mm as shown in FIG. 18.

EXAMPLE 21

Figure 15:
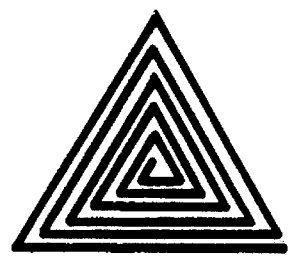
Figure 16:
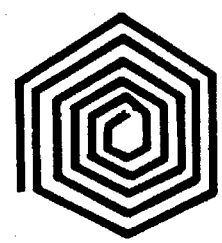
Figure 17:
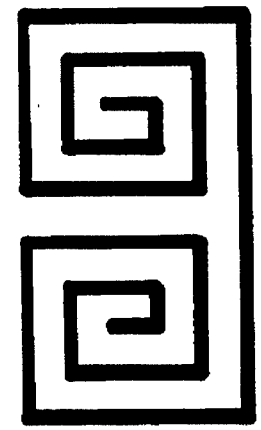

Experiments of Example 8 were repeated to obtain an electromagnetic wave reflection-preventing material except that a pattern used in the pattern coating layer (E) is formed by arranging a triangular spiral pattern unit shown in FIG. 15 and having a longest side length of 20 mm, a band width of about 250 μm and a space between bands of 250 μm so that a distance between apexes of respective pattern units may be 0.5 mm respectively, as likely shown in FIG. 12.

The electromagnetic wave reflection-preventing materials in Examples 1–6, 8–9, and 11–18, the electromagentic wave reflection-preventing structures in Examples 7, 10 and 19, the laminates in Comparative Examples 1–2 and the comparative electromagnetic wave reflection-preventing material in Comparative Examples 3 were subjected to measurements of the electromagnetic wave reflection-preventing effect by the following method. The results are shown in the following Table 1. The weights of the electromagnetic wave reflection-preventing materials in Examples 1–6, 8–9, and 11–18, the laminates of Comparative Examples 1–2, and of the comparative electromagnetic wave reflection-preventing material of Comparative Example 3 are shown in Table 1. Regarding to Examples 7, 10 and 19, the weight of the laminate adhered onto the steel pole, excepting the steel pole itself, is shown in Table 1.

Method of Measuring the Electromagnetic Wave Reflection-Preventing Effect

A transmitting horn antenna and a receiving horn antenna was set within a microwave dark room, onto the wall of which was adhered an electromagnetic wave absorber having an elecromagnetic wave reflectance of 0.01% or less, so that an angle between an incident electromagnetic wave and reflected electromagnetic wave may be 5°, and a metallic reflecting plate was placed at a distance of 50 cm from respective antennas thereafter, reflected signals are received by the receiving horn antenna to measure the resulting electromagnetic wave reflectance to be 100%. Next, a measuring sample was placed in place of the metallic reflecting plate to measure a maximum absorption frequency, an electromagnetic wave reflectance at the maximum absorption frequency, and an effective absorption frequency range, which is a frequency range to show an electromagnetic wave reflectance of 1% or less around the maximum absorption frequency, from signals reflected from the surface of the measuring sample over varied frequencies.

TABLE 1

| Example | Maximum absorption frequency (GH$_z$) | Electromagnetic wave reflectance (%) | Effective absorption frequency area (GH$_z$) | Weight (kg/m$^2$) | Thickness (mm) |
|---|---|---|---|---|---|
| Example 1 | 9.5 | 0.1 | 6.3–12.8 | 1.7 | 0.7 |
| Example 2 | 13.5 | 0.3 | 10.9–16.1 | 1.5 | 0.65 |
| Example 3 | 11.0 | 0.2 | 8.5–13.3 | 1.3 | 0.48 |
| Example 4 | 7.2 | 0.2 | 5.6–9.2 | 1.9 | 1.09 |
| Example 5 | 11.0 | 0.04 | 8.6–13.4 | 1.4 | 0.48 |
| Example 6 | 10.1 | 0.1 | 6.6–13.7 | 1.3 | 0.43 |
| Example 7 | 11.0 | 0.2 | 8.6–13.4 | 0.9 | 0.43 |
| Example 8 | 9.2 | 0.1 | 6.5–12.3 | 1.1 | 0.50 |
| Example 9 | 7.0 | 0.2 | 5.3–9.0 | 1.1 | 0.65 |
| Example 10 | 9.2 | 0.1 | 6.6–12.4 | 1.0 | 0.45 |
| Example 11 | 10.3 | 0.2 | 8.1–12.9 | 0.8 | 0.36 |
| Example 12 | 10.8 | 0.1 | 7.2–13.5 | 0.8 | 0.45 |
| Example 13 | 8.7 | 0.1 | 5.2–11.2 | 1.4 | 0.72 |
| Example 14 | 7.1 | 0.1 | 5.5–8.7 | 1.2 | 0.60 |
| Example 15 | 9.2 | 0.2 | 6.6–12.0 | 1.0 | 0.56 |
| Example 16 | 11.2 | 0.05 | 9.1–13.4 | 1.5 | 0.86 |
| Example 17 | 10.3 | 0.1 | 8.3–12.3 | 1.1 | 0.53 |
| Example 18 | 9.6 | 0.1 | 7.6–11.6 | 0.9 | 0.43 |
| Example 19 | 9.2 | 0.2 | 6.8–12.0 | 0.9 | 0.51 |
| Example 20 | 9.1 | 0.1 | 5.5–11.5 | 1.4 | 0.72 |
| Example 21 | 9.5 | 0.1 | 6.8–12.6 | 1.1 | 0.50 |
| Comp.Ex. 1 | 9.5 | 71.2 | — | 0.13 | 0.17 |
| Comp.Ex. 2 | 11.2 | 1.2 | 10.6–11.7 | 8.1 | 3.05 |
| Comp.Ex. 3 | 9.5 | 0.8 | 8.6–10.6 | 1.1 | 0.57 |

What is claimed is:

1. An electromagnetic wave reflection-preventing material having a structure which has been formed by successively laminating (A) an electromagnetic wave reflecting metallic material layer, (B) a substrate layer, (C) a resin layer containing a powder of at least one member selected from the group consisting of ferrite powder, carbon powder, metal powder and electrically conductive metallic oxides powder consisting of tin oxide and indium oxide, or a mixture of the above selected powder and a good dielectric material selected from the group consisting of titanate compound, silicon carbide and silicon nitride, wherein the amount of the metal powder is less than 20 parts by weight per 100 parts by weight of the resin, (D) a supporting film layer, and (E) a pattern coating layer which has been prepared in the form of a geometrical pattern, which contains 25 to 500 parts by weight of a metal powder per 100 parts by weight of the solid content of the resin, which has a volume resistivity of $10^{-3}$ to $10^6$ Ω·cm, and which has an uncoated area to coated area ratio of 0.05 to 20.

2. An electromagnetic wave reflection-preventing material having a structure which has been formed by successively laminating (A) an electromagnetic wave reflecting metallic material layer, (B) a substrate layer, (C) a resin layer containing a powder of at least one member selected from the group consisting of ferrite powder, carbon powder, metal powder and electrically conductive metallic oxides powder consisting of tin oxide and indium oxide, or a mixture of the above selected powder and a good dielectric material selected from the group consisting of titanate compound, silicon carbide and silicon nitride, wherein the amount of metal powder is less than 20 parts by weight per 100 parts by weight of the resin, and (E) a pattern coating layer which has been prepared in the form of a geometrical pattern, which contains 25 to 500 parts by weight of a metal powder per 100 parts by weight of the solid content of the resin, which has a volume resistivity of $10^{-3}$ to $10^6$ Ω·cm, and which has an uncoated area to coated area ratio of 0.05 to 20.

3. An electromagnetic wave reflection-preventing material having a structure which has been formed by successively laminating (A) an electromagnetic wave reflecting metallic material layer, (C) a resin layer containing a powder of at least one member selected from the group consisting of ferrite powder, carbon powder, metal powder and electrically conductive metallic oxides powder consisting of tin oxides and indium oxide, or a mixture of the above selected powder and a good dielectric material selected from the group consisting of titanate compound, silicon carbide and silicon nitride, wherein the amount of the metal powder is less than 20 parts by weight per 100 parts by weight of the resin, (D) a supporting film layer, and (E) a pattern coating layer which has been prepared in the form of a geometrical pattern, which contains 25 to 500 parts by weight of a metal powder per 100 parts by weight of the solid content of the resin, which has a volume resistivity of $10^{-3}$ to $10^6$ Ω·cm, and which has an uncoated area to coated area ratio of 0.05 to 20.

4. An electromagnetic wave reflection-preventing material having a structure which has been formed by successively laminating (A) an electromagnetic wave reflecting metallic material layer, (C) a resin layer containing a powder of at least one member selected from the group consisting of ferrite powder, carbon powder, metal powder and electrically conductive metallic oxides powder consisting of tin oxide and indium oxide, or a mixture of the above selected powder and a good dielectric material selected from the group consisting of titanate compound, silicon carbide and silicon nitride, wherein the amount of the metal powder is less than 20 parts by weight per 100 parts by weight of the resin, and (E) a pattern coating layer which has been prepared in the form of a geometrical pattern, which contains 25 to 500 parts by weight of a metal powder per 100 parts by weight of the solid content of the resin, which has a volume resistivity of $10^{-3}$ to $10^6$ Ω·cm, and which has an uncoated area to coated area ratio of 0.05 to 20.

5. An electromagnetic wave reflection-preventing material having a structure which has been formed by successively laminating (A) an electomagnetic wave reflecting metallic material layer, (G) a molded sheet layer having a thickness of 50 µm to 3 mm and which has been formed by coating a coating composition which has been prepared by dispersing a powder of at least one member selected from the group consisting of ferrite powder, carbon powder, metal powder and electrically conductive metallic oxides powder consisting of tin oxide and indium oxide, or a mixture of the above selected powder and a good dielectric material selected from the group consisting of titanate compound, silicon carbide and silicon nitride, into a binder, onto a substrate selected from the group consisting of a paper, a cloth sheet, a nonwoven fabric and a porous sheet, followed by molding under pressure, wherein the amount of the metal powder is less than 20 parts by weight per 100 parts by weight of the resin, (D) a supporting film layer, and (E) a pattern coating layer which has been prepared in the form of a geometrical pattern, which contains 25 to 500 parts by weight of a metal powder per 100 parts by weight of the solid content of the resin, which has a volume resistivity of $10^{-3}$ to $10^6$ Ω·cm, and which has an uncoated area to coated area ratio of 0.05 to 20.

6. An electromagnetic wave reflection-preventing material having a structure which has been formed by successively laminating (A) an electromagnetic wave reflecting metallic material layer, (G) a molded sheet layer having a thickness of 50 µm to 3 mm and which has been formed by coating a coating composition which has been prepared by dispersing a powder of at least one member selected from the group consisting of ferrite powder, carbon powder, metal powder and electrically conductive metallic oxides powder consisting of tin oxide and indium oxide, or a mixture of the above selected powder and a good dielectric material selected from the group consisting of titanate compound, silicon carbide and silicon nitride, into a binder, onto a substrate selected from the group consisting of a paper, a cloth sheet, a nonwoven fabric and a porous sheet, followed by molding under pressure, wherein the amount of the metal powder is less than 20 parts by weight per 100 parts by weight of the resin, and (E) a pattern coating layer which has been prepared in the form of a geometrical pattern, which contains 25 to 500 parts by weight of a metal powder per 100 parts by weight of the solid content of the resin, which has a volume resistivity of $10^{-3}$ to $10^6$ Ω·cm, and which has an uncoated area to coated area ratio of 0.05 to 20.

7. The electromagnetic wave reflection-preventing material as claimed in claim 1, 2, 3, 4, 5 or 6, wherein (F) a clear or colored coating layer is further laminated onto the pattern coating layer (E).

8. The electromagnetic wave reflection-preventing material as claimed in claim 1, 2, 3, 4, 5 or 6, wherein (E) the pattern coating layer is prepared in the form of a pattern wherein a plurality of band-shaped figures are combined so as not to contact with each other and to form a multifigured structure as a pattern unit, and a plurality of pattern units are arranged to form the pattern, wherein said band-shaped-figure is a figure in a geometrical shape formed by a band having a width of 0.01 to 5 mm and a ratio of an arithmetic mean of its length to an arithmetic mean of its width in the range of 3:1 to $10^4$:1.

9. The electromagnetic wave reflection-preventing material as claimed in claim ;1, 2, 3, 4, 5 or 6, wherein (E) the pattern coating layer is prepared in the form of a pattern wherein a pattern unit is formed by a continuous band-shaped figure which is a plurality of pattern units, which are arranged to form the pattern, wherein said continuous band having a width of 0.01 to 5 mm and a ratio of an arithmetic mean of its length to an arithmetic mean of its width in the range of 3:1 to $10^6$:1, to be the pattern unit having a geometrical shape as a whole.

10. The electromagnetic wave reflection-preventing material as claimed in claim 1, 2, 3, 4, 5 or 6, wherein said continuous band-shaped figure of said pattern coating layer (E) is a spiral figure.

* * * * *